(12) United States Patent
Petrescu-Prahova et al.

(10) Patent No.: US 6,522,677 B1
(45) Date of Patent: Feb. 18, 2003

(54) HIGH POWER LASER DIODE

(76) Inventors: Iulian Basarab Petrescu-Prahova, Aleea Poiana Cernei No 4, Bl. E4, AP34, Bucharest (RO); Manuela Buda, 572 Apusului 58, Pl 70, sc.A, ap.3, et B Grevenmacherhot 36, 5625 LV Eindhoven (NL); Aurel Mihai Vlaicu, Str. G-ral. Grigoraacu 29, Zip 4400 6-2F-5, Shiba-No-Higashi, Gokasho, Uji (JP), 611-0011

( * ) Notice: Subject to any disclaimer, the term of this patent is extended or adjusted under 35 U.S.C. 154(b) by 0 days.

(21) Appl. No.: 09/051,605
(22) PCT Filed: Aug. 18, 1995
(86) PCT No.: PCT/RO95/00011
§ 371 (c)(1),
(2), (4) Date: Nov. 30, 1999
(87) PCT Pub. No.: WO96/08062
PCT Pub. Date: Mar. 14, 1996

(30) Foreign Application Priority Data

Sep. 9, 1994 (RO) .................................. 94-01494

(51) Int. Cl.$^7$ .................................................. H01S 5/32
(52) U.S. Cl. ........................................................ 372/45
(58) Field of Search .............................. 372/44, 45, 46

(56) References Cited

U.S. PATENT DOCUMENTS 4,315,226 A * 2/1982 Chinone et al. .............. 372/45

* cited by examiner

Primary Examiner—James Davie
(74) Attorney, Agent, or Firm—Thomas R. Vigil; Welsh & Katz, Ltd.

(57) ABSTRACT

The high power laser diode comprise an active region and a trapping region separated by a passive region, all situated between a p-type confinement region and an n type confinement region such that the radiation field is attracted toward and spread into the trapping region assuring a reduced value for the confinement factor into the active region.

9 Claims, 4 Drawing Sheets

HIGH POWER LASER DIODE

FIELD OF THE INVENTION

The invention describes a high power laser diode with potential use in ophthalmology, surgery, printing, magneto-optical data storage.

BACKGROUND OF THE INVENTION

There are already known high power laser diodes made of symmetrical structures with separate confinement in which the light is emitted in a very narrow active region and is guided by a larger wave guide. These diodes have the following disadvantages:

they are optimized for low threshold current and as a consequence they have an as high as possible confinement factor (the ratio of the power density through the active region to the total power density) and that induces the catastrophical degradation of the mirror at relative small power densities and allows the optimal operation only for short devices, due to the high value of the modal gain;

they have reduced operational safety due to the low value of the active region thickness;

they are not optimized for maximum power densities, relative to the emitting stripe width, optimization for which two conditions have to be fulfilled: a low value of the confinement factor (<0.01) together with a high value of the active region thickness (>10 nm).

There are already known high power laser diodes structures with low confinement factor, in the range 0.0015 and 0.00015 (patent RO 102871, PCT Application RO 91/0002), consisting of a main region of the wave guide (2–5 $\mu$m thickness) and of an active region, lateral to the main region and separated from it by an intermediate region. The radiation propagates mainly in the main region, which is very large, and the cut-off of the high-order modes is realized by a very small step of the refractive index value between the confinement region and the main region. They have the following disadvantages:

the imposed step of the refractive index between the main region and the confinement region is very small and very difficult to be realized from the technological point of view, the passive region confinement factor value is almost equal to unity and its band gap is very close to the energy of the propagating photons, conditions which together can enhance two photon absorption.

SUMMARY OF THE INVENTION

The problem solved by this invention is the designing of a laser diode structure made of multiple layers which operates with a low value of the confinement factor less, than 0.015, and which has the thickness of the active region greater than 0.01 $\mu$m and small values for the confinement factor of the small energy gap layers, others than the active region.

The high power laser diode structures, corresponding to this invention, eliminate the disadvantages of the other known solutions since they are comprised of an n-type confinement region; a p-type confinement region which has the lowest value of the refractive index in the structure; a passive region situated between the two confinement regions which represents the main part of the wave guide and whose refractive index may be lowered stepwise or continuously relative to the refractive index of the n-type confinement region, this decrease being greater at (towards) the limit of separation between the passive region and the p-type confinement region; a thin active region situated asymmetrically in the passive region and closer to the p-type confinement region and whose refractive index is much greater than the refractive index of the passive region; a thin balance region situated at the limit between the passive region and the n-type confinement region, which balance the action of the active region and whose refractive index is much higher than the refractive index of its neighbor regions, i.e. the passive region and the n-type confinement region; the structure being such that the refractive index profile has two marked bumps, one corresponding to the active region and the other corresponding to the balance region, both bumps having the magnitude less than $\lambda/4$. due to the very small thickness of these two regions; and such that the energy band gap of the balance region is much greater than the energy band gap of the active region to avoid the absorption in the balance region of the radiation emitted in the active region; and since, by the combined action of two factors, the prevalent attraction of the field by the balance region as compared with the attraction of the active region and the repelling toward the n-type confinement region of the field due to the refractive index step at the margin between the p-type confinement region and the passive region, the named laser diode structures assures a field distribution with its maximum situated in the balance region, outside the active region bump, and a reduced value for the confinement factor of the active region by repelling the field distribution maximum from the active region, together with a reduced value of the confinement factor of the balance region due to its low thickness.

The high power laser diodes according to the invention present the following advantages:

they have a reduced confinement factor, lower than 0.015, although the active region is rather thick, thicker than 10 nm;

they operate in the fundamental transversal mode;

they have low confinement factor for low band gap regions others than the active region;

they allow the fabrication of stripes with low modal gain.

BRIEF DESCRIPTION OF THE DRAWINGS

In the following, other features of the diodes according to the invention will become apparent from the specific description and examples, in connection with FIGS. 1–7 which represent.

DESCRIPTION OF THE PREFERED EMBODIMENT

Figure 1:
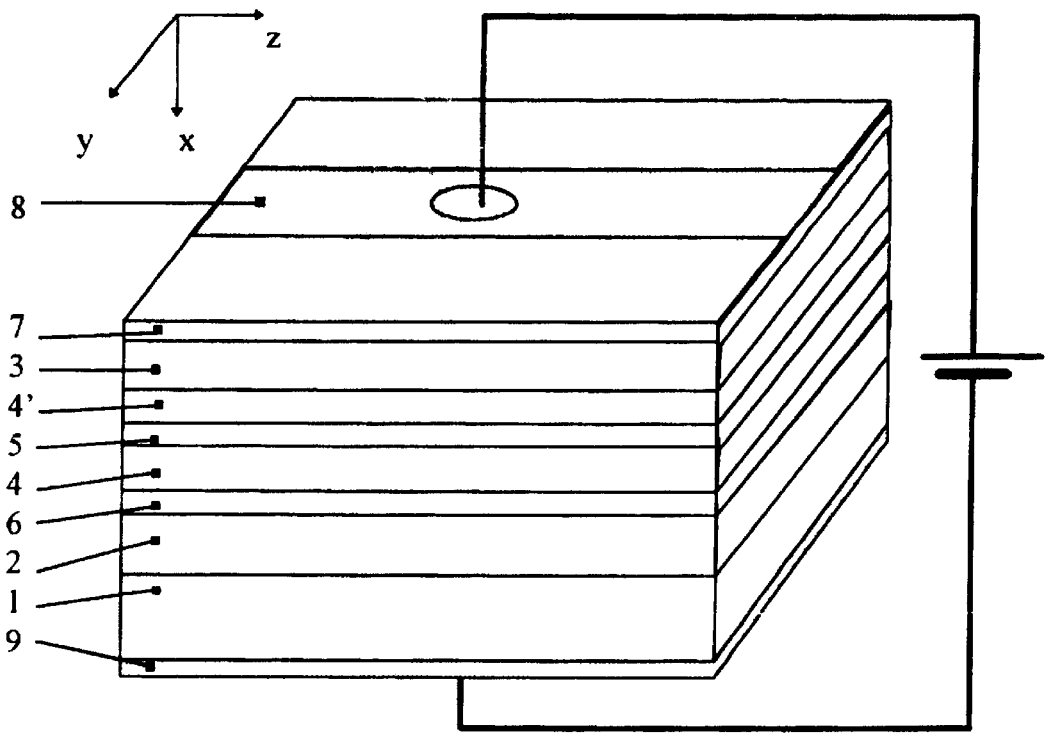
FIG. 1: a perspective view of the laser diodes according to the invention

The high power laser diode structure according to the invention, and related to FIG. 1, consists of the following regions: a substrate 1, an n-type confinement region 2, a p-type confinement region 3, a passive region 4, situated between the two named confinement regions and which constitutes the main part of the wave guide, an active region 5, situated inside the wave guide and closer to the p-type confinement region, a balance region 6 which equilibrates the active region influence, situated inside the wave guide at the separation limit between the passive region and the n-type confinement region, a contact layer 7, a p-type metallic contact 8, and a n-type metallic contact 9. Because in some cases it is possible for the active region to be not always situated at the limit between the passive region and the p-type confinement layer, in these cases the passive region is divided into two parts: a part 4, between the balance region 6 and the active region 5, and a part 4', between the active region 5 and the p-type confinement region 3. With reference to an orthogonal coordinate system Ozyx, the regions interfaces are parallel to each other and also parallel with the plane yOz, and the laser radiation is propagating in the Oz direction. The laser radiation is produced in the active region by the injection of the minority carriers in a p-n junction situated inside or in the neighborhood of the active region. The injection current is produced by applying a positive bias between the two metallic contacts 8 and 9.

In each layer propagates a power flux $P_1 \ldots P_7$ so that the total power is $P=\Sigma P_1$. For each region a confinement factor $\Gamma_1 \ldots \Gamma_7$ can be defined, and by definition $\Gamma_1=P_1/P$.

Figure 3:
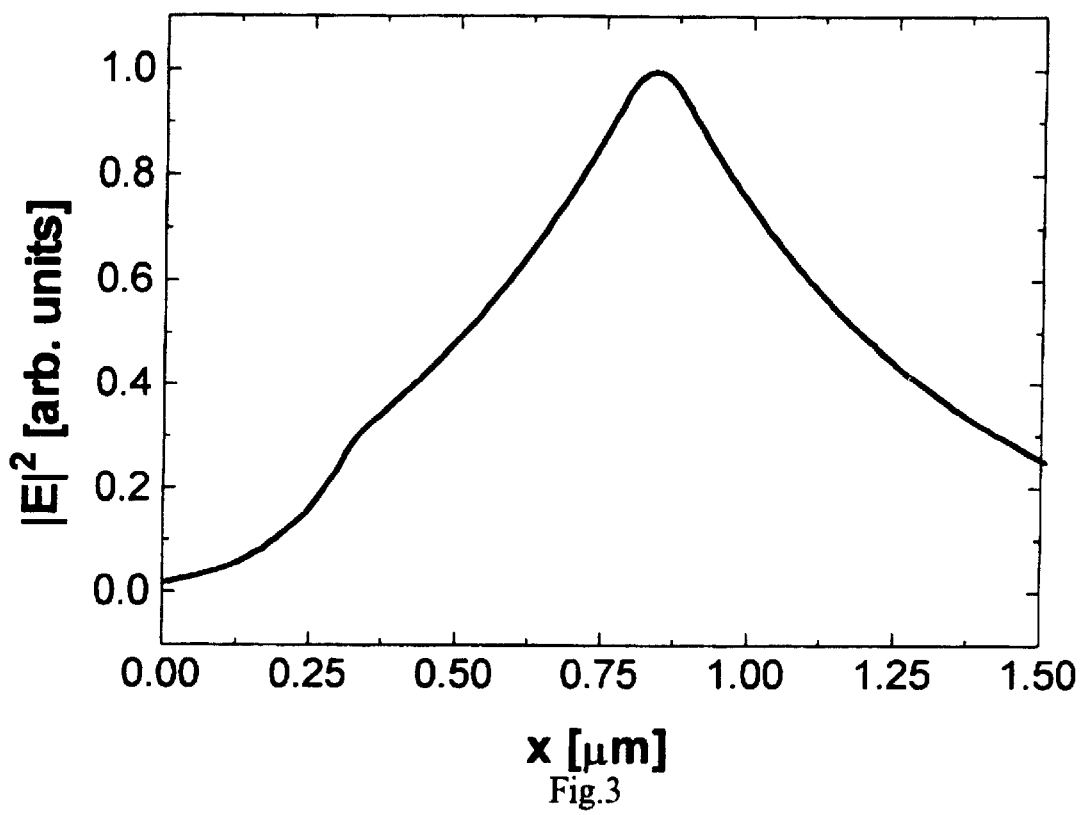
FIG. 3: the field distribution of the structure in FIG. 2
Figure 4:
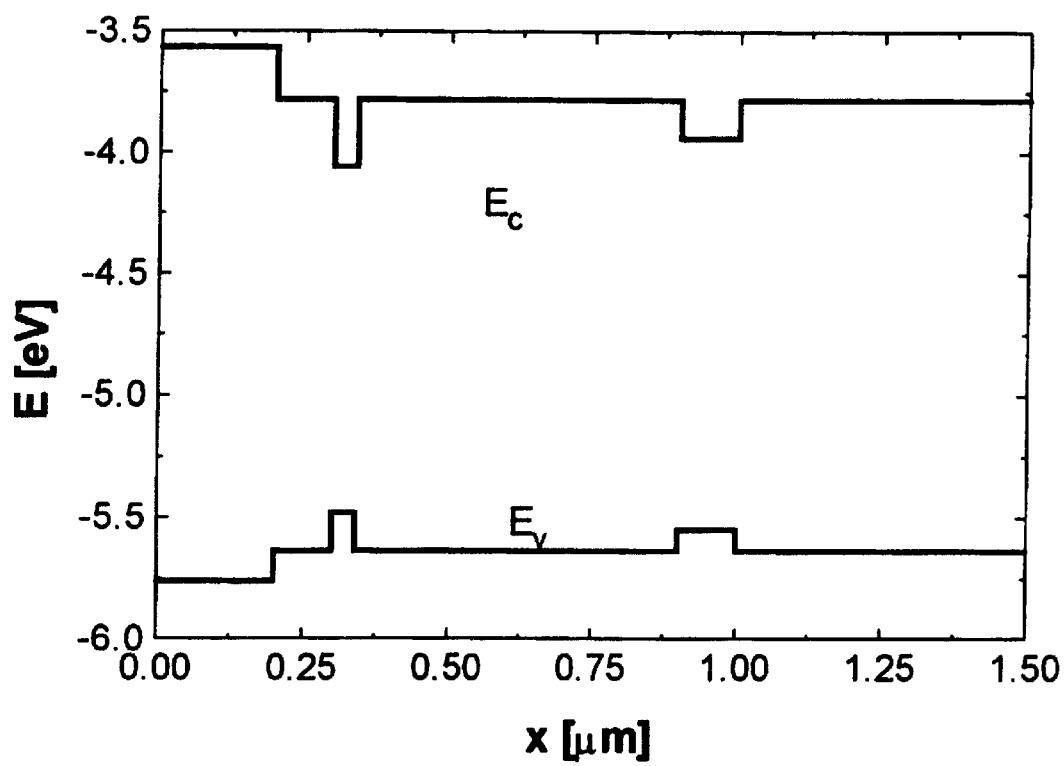
FIG. 4: the energy band gap profile for the structure in FIG. 2

The refraction index varies in the Ox direction. The refraction indexes for the regions 1 ... 7 have correspondingly the symbols $n_1 \ldots n_7$. The profile of the refractive index along the Ox direction for a typical structure is presented in FIG. 2. The field distribution in this structure in presented in FIG. 3. The profile of the energy band gap of the regions along the Ox direction is presented in FIG. 4. The refractive index profile has two bumps: a bump 10 corresponding to active region and a bump 11 corresponding to the balance region. The active region 5 is situated near the p-type confinement layer 3, and the balance region 6 is situated at the separation limit between the passive region 4 and n-type confinement region 2. The thickness of the active region and of the balance region are $d_5$ and $d_6$, respectively, and the thickness of the passive region including $d_5$ and $d_6$, is $d_4$. The distances between the balance region and the active region, and between the active region and the p-type confinement region, are $I_4$ and $I'_4$, respectively. The refractive index of the active region $n_5$ has the highest value. This high value is a consequence of a low value of the energy band gap of the active region. The energy band gap of the passive region is higher, in order to obtain an efficient carrier confinement inside the active region. Corresponding to this higher value of the energy band gap, the refractive index in the passive region $n_4$, is lower than $n_5$. The difference of the refractive indexes $(n_5-n_4)$ determines, together with the effective thickness of the active region $d_5$, the magnitude of a bump in the refractive index profile, magnitude equal to:

$$d_5 \, (n_5^2 - n_4^2)^{1/2}$$

To avoid the confinement of the radiation field inside the active region, the magnitude of the bump of the active region must be lower than $\lambda/4$, i.e. the following condition has to be fulfilled:

$$d_5 \, (n_5^2 - n_4^2)^{1/2} \therefore \lambda/4 \tag{1}$$

The lowest value of the refractive index is that of the p-type confinement region, $n_3$. The next higher value is that of the refractive index of the passive region $n_4$, then that of the refractive index of the n-type confinement region, $n_2$. A high difference between $n_4$ and $n_3$, induces the repelling of the optical field toward the n-type confinement region.

The balance region 6 has the role to attract toward it the maximum of the optical field distribution, thus reducing the value of the confinement factor. The refractive index of this region, $n_6$, is higher than the refractive index of the adjacent regions: the passive region and the n-type confinement region. The attraction of the optical field toward the bump of the balance region is enhanced by the repelling of the optical field due to the existence of a high variation of the refractive index at the limit between the passive region and p-type confinement region to make the action of the balance region more efficient, the magnitude of the its bump must be as high as possible, i.e. the difference $n_6-n_2$ must be as high as possible. On the other hand $n_6$ can not be very close to ns because this would determine the energy band gap of the active region and the balance region to be also very close and this would induce the balance region absorption of the radiation emitted in the active region. Although the efficiency of the bump of the balance region is direct proportional with its magnitude, the magnitude of the bump of the balance region must not be very close to the $\lambda/4$ value, since in this case the optical field would be captured entirely inside the balance region, $\Gamma_6$ would become almost unity, and the two photons absorption processes in a region with a relative narrow energy band gap would be predominant compared with the other absorption processes.

To obtain low values of the confinement factor $\Gamma_5$, the active region must be as far as possible from the middle of the wave guide. At the limit it will be near the p-type confinement region and $I'_4=0$. The distance between the active region and the balance region is $I_4$.

The higher order modes are cutt off by imposing the conditions that the refractive index of the n-type confinement region is higher or equal then the refractive index of the passive region and that the two bump magnitudes are lower than $\lambda/4$. To avoid the higher order modes, a small (positive) difference between the refractive index of the n-type confinement region and the refractive index of the passive region should be used, especially in the case when the two bumps, both of high magnitude, are far from one another.

To illustrate the combined action, the repelling of the optical field due to the difference between the values of the refractive index of the passive region and the p-type confinement region, on one hand, and the attraction of the optical field toward the balance region, on the other hand, we will first analyze two structures differing by the thickness of the passive region. Both structures have the thickness of the active region $d_5=80$ nm and the thickness of the balance region $d_6=60$ nm. It is obvious that the bump of the balance region is lower than the bump of the active region, if one takes in account their thickness and the fact that the refractive index of the balance region is lower than the refractive index of the active region. Both structures consists of multiple regions from the system $Al_xGa_{1-x}As$, with the following composition indexes: the p-type confinement region 3 with $x_3=0.6$, next to it the active region 5 with $x_5=0.0$, then the passive region 4 with $x_4=0.35$, the balance region 6 with $x_6=0.15$, and the n-type confinement region 2 with $x_2=0.332$. The refractive indexes are determined by the corresponding composition indexes (the refractive indexes decrease when the composition indexes increase). If the first analyzed structure would have the thickness of the passive region 4, $d_4=0.88$ $\mu$m then it has a confinement factor of the active region $\Gamma_5=0.0147$ and a confinement factor of the balance region $\Gamma_6=0.053$. If for the second structure the thickness of the passive region 4 would be increased at $d_4=1.45$ $\mu$m then, the two above mentioned confinement factor decrease to $\Gamma_5=0.00165$ and $\Gamma_6=0.0456$, respectively.

Figure 2:
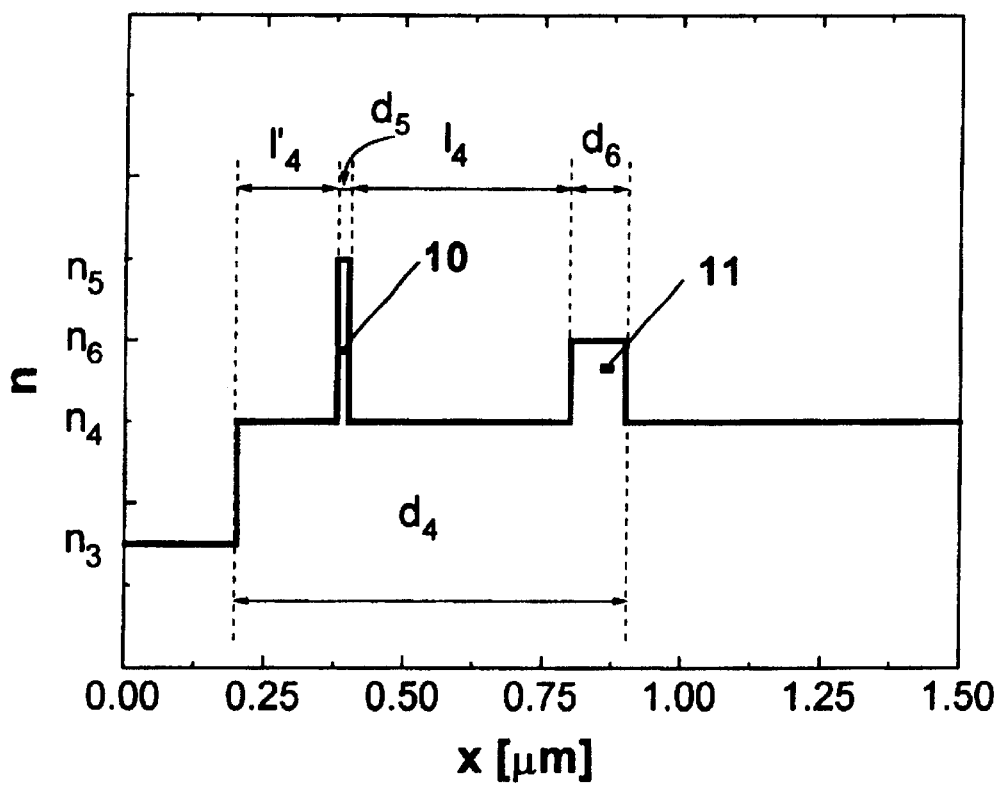
FIG. 2: a refractive index profile along the direction perpendicular to the wave guide layers

An other example is illustrated by FIG. 2. The p-type confinement region 3 has, as in the above mentioned example, a composition index $x_3=0.6$. The passive region 4 and the n-type confinement region 2 have equal composition indexes $x_4=x_2=0.35$. The active region 5, with $x_5=0.0$ and $d_5=20$ nm, is separated from the p-type confinement region 3 at a distance $I'_4=0.18$ $\mu$m, and the balance region 6 with $x_6=0.15$ and $d_6=100$ nm is separated from the active region 5 at a distance $I_4=0.4$ $\mu$m. This structure has a confinement factor of the active region $\Gamma_5=0.0072$ and a confinement factor of the balance region $\Gamma_6=0.193$.

In the following, other examples of structures with low confinement factor and with relatively high thickness of the active region, in the range 10 . . . 80 nm will be presented. In these examples the thickness of the balance region was chosen to be 100 nm. The fact that the thickness of the balance region is higher compared to values of the above first presented examples, determines a higher value for the confinement factor of this region, a possible enhancement of the two-photon absorption effects and a contraction of the width of the field distribution. The values chosen as examples for the confinement factor are 0.0144, 0.0072, 0.0036, 0.0018. The values chosen as examples for the thickness of the active region are 10 nm, 20 nm, 40 nm and 80 nm. The case for the 10 nm active region thickness wood need some correction for the values of the refractive indexes of the structure corresponding to the quantum well effects. This corrections are not essential for the demonstration and are not taken into account.

In all following examples the active region is adjacent to the p-type confinement region, thus that $I'_4=0.0$. This selection simplifies the procedures for the stripe fabrication, which will be discussed later.

In the first set of examples, those from table 1, the structures will consists of semiconductor materials from the $Al_xGa_{1-x}As$ system with the composition indexes $x_4=0.35$, $x_5=0.0$, $x_6=0.15$. The composition index of the p-type confinement region is $x_3=0.35$ for the case $d_5$ 10 nm, is $x_3=0.40$ for the case $d_5=20$ nm, is $x_3=0.48$ case $d_5=40$ nm and is $x_3=0.60$ for the case $d_5=80$ nm. The increase in the composition index of the p-type confinement region is determined by the necessity of an, as efficient as possible, repelling action of the optical field from the p-type confinement region. The composition index of the n-type confinement region 2, is $x_2=x_4$ for the most cases, except for the cases where the thickness of the active region is 80 nm, when differences of the composition indexes between the n-type confinement region and the passive region have been introduced to cut-off the higher order modes. The examples shall be given for a active region made up of a single 'thick' layer. Small differences may appear if a few quantum-wells replace a single equivalent 'thick' layer.

TABLE 1

| No. | $d_5$ (nm) | $\Gamma_5$ | $x_2$ | $x_3$ | $l_4$ ($\mu$m) | $\Gamma_6$ |
|---|---|---|---|---|---|---|
| 1 | 10 | 0.0144 | 0.35 | 0.35 | 0.08 | 0.195 |
| 2 | 10 | 0.0072 | 0.35 | 0.35 | 0.255 | 0.181 |
| 3 | 10 | 0.0036 | 0.35 | 0.35 | 0.44 | 0.179 |
| 4 | 10 | 0.0018 | 0.35 | 0.35 | 0.62 | 0.180 |
| 5 | 20 | 0.0144 | 0.35 | 0.40 | 0.23 | 0.199 |

TABLE 1-continued

| No. | $d_5$ (nm) | $\Gamma_5$ | $x_2$ | $x_3$ | $l_4$ ($\mu$m) | $\Gamma_6$ |
|---|---|---|---|---|---|---|
| 6 | 20 | 0.0072 | 0.35 | 0.40 | 0.38 | 0.192 |
| 7 | 20 | 0.0036 | 0.35 | 0.40 | 0.55 | 0.188 |
| 8 | 20 | 0.0018 | 0.35 | 0.40 | 0.70 | 0.187 |
| 9 | 40 | 0.0144 | 0.35 | 0.48 | 0.40 | 0.191 |
| 10 | 40 | 0.0072 | 0.35 | 0.48 | 0.57 | 0.187 |
| 11 | 40 | 0.0036 | 0.35 | 0.48 | 0.74 | 0.186 |
| 12 | 40 | 0.0018 | 0.35 | 0.48 | 0.90 | 0.186 |
| 13 | 80 | 0.0144 | 0.335 | 0.60 | 0.77 | 0.163 |
| 14 | 80 | 0.0072 | 0.330 | 0.60 | 0.86 | 0.161 |
| 15 | 80 | 0.0036 | 0.325 | 0.60 | 0.93 | 0.154 |
| 16 | 80 | 0.0018 | 0.320 | 0.60 | 0.98 | 0.143 |

Analyzing the table, one can see that there are a few possibilities to reduce the confinement factor:
- the reduction of the refractive index in the p-type confinement region (sequence 13 . . . 16 compared to sequence 9 . . . 12 etc.)
- the enlargement of the distance between the active region and the balance region (inside each sequence 1 . . . 4, 5 . . . 8, 9 . . . 12, 13 . . . 16)
- the increase of the refractive index in the n-type confinement region compared to the refractive index in the passive region (examples 13 . . . 16)

Beside these possibilities there is also the possibility to increase the distance between the active region and the p-type confinement region and to reduce in this way the repelling action for the optical field, and so to enhance the confinement factor.

TABLE 2

| No. | $d_5$ (nm) | $\Gamma_5$ | $x_2$ | $x_3$ | $l_4$ ($\mu$m) | $\Gamma_6$ |
|---|---|---|---|---|---|---|
| 1 | 10 | 0.0144 | 0.35 | 0.35 | 0.09 | 0.206 |
| 2 | 10 | 0.0072 | 0.35 | 0.35 | 0.26 | 0.191 |
| 3 | 10 | 0.0036 | 0.35 | 0.35 | 0.44 | 0.189 |
| 4 | 10 | 0.0018 | 0.35 | 0.35 | 0.60 | 0.191 |
| 5 | 20 | 0.0144 | 0.35 | 0.40 | 0.22 | 0.213 |
| 6 | 20 | 0.0072 | 0.35 | 0.40 | 0.36 | 0.205 |
| 7 | 20 | 0.0036 | 0.35 | 0.40 | 0.51 | 0.201 |
| 8 | 20 | 0.0018 | 0.35 | 0.40 | 0.67 | 0.199 |
| 9 | 40 | 0.0144 | 0.35 | 0.48 | 0.40 | 0.201 |
| 10 | 40 | 0.0072 | 0.35 | 0.48 | 0.56 | 0.198 |
| 11 | 40 | 0.0036 | 0.35 | 0.48 | 0.71 | 0.197 |
| 12 | 40 | 0.0018 | 0.35 | 0.48 | 0.86 | 0.197 |
| 13 | 80 | 0.0144 | 0.335 | 0.60 | 0.60 | 0.167 |
| 14 | 80 | 0.0072 | 0.330 | 0.60 | 0.60 | 0.161 |
| 15 | 80 | 0.0036 | 0.325 | 0.60 | 0.60 | 0.154 |
| 16 | 80 | 0.0018 | 0.320 | 0.60 | 0.60 | 0.143 |

Figure 5:
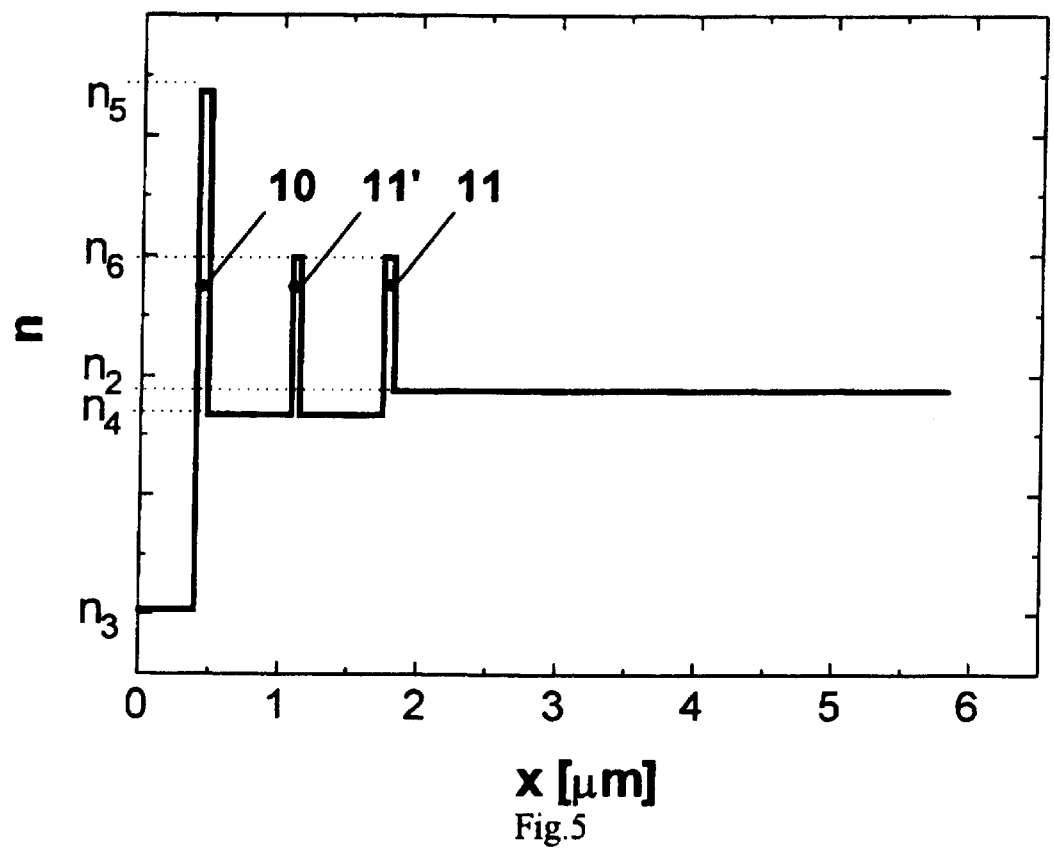
FIG. 5: a refractive index profile for a structure with two balance regions
Figure 6:
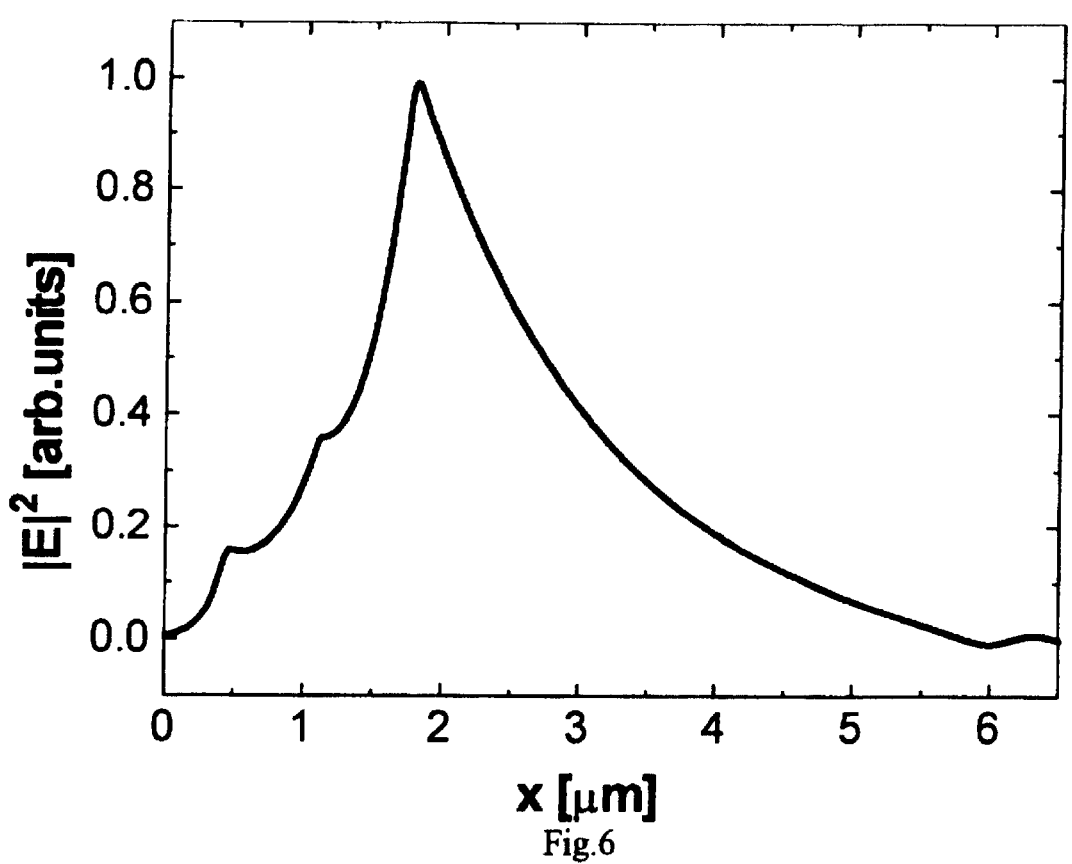
FIG. 6: the field distribution for the structure in FIG. 5

In table 2 examples of laser diode structures with an other set of composition indexes are shown, differing from the one used for table 1, so that the composition index of the active region is 0.11 and the wavelength of the emitted light is close to 800 nm. The composition indexes for regions 4, 5, 6 are: 0.35, 0.11 and 0.21, respectively, and the composition indexes for the p-type confinement region are 0.35, 0.40, 0.48 and 0.60 for active region thickness of 10 nm, 20 nm, 40 nm and 80 nm, respectively. The composition index in the n-type confinement layer 2 is given in the table for each case separately. The refractive index in the n-type confinement region step up compared to the refractive index of the passive region will be exploited to cut-off the higher order modes in structures with the thickest active region We consider that the concepts shown in this invention and the examples given for structures in the $Al_xGa_{1-x}As$ system, having constant composition index layers, can be extended to other cases too:

materials from the InGaAs, InGaAsP, InGaAlAs systems, and other large energy band gap materials, with an as low as possible probability for the two-photon processes;

structures with continuous gradual (not stepwise) variation of the refractive index;

An other extension of the invention refers to the number of balance regions. Beside the balance region 6 at the limit of the passive region 4 and the n-type confinement region 2, one or more secondary balance regions, 6', 6" etc. can be introduced between the balance region 6 and the active region 5, with the value of the bumps 11', 11" etc. also lower than $\lambda/4$. In the following we shall give an example of a structure with a secondary balance region having the following properties: the composition indexes for the p-type confinement region 3, the passive region 4 the active region 5, the secondary balance region 6', the main balance region 6 and the n-type confinement region 2 are: 0.6, 0.35, 0.0, 0.15, 0.15 and 0.32, respectively. The thickness of the active region 5, the secondary balance region 6' and the main balance region 6 are 80 nm, 60 nm and 80 nm respectively. The active region is placed at the limit between the p-type confinement region 3 and the passive region 4. The distance between the active region 5 and the secondary balance region 6' and the distance between the secondary balance region 6' and the main balance region 6 are both equal to 0.6 $\mu$m. This structure has a confinement factor of $1.87\ 10^{-3}$. The refractive index profile of this structure is presented in FIG. 5. The optical field distribution for this structure is presented in FIG. 6.

The above described structures can be obtained by epitaxyally growth, with thin layers, parallel each another and to the growth substrate. Stripes with a width w of several microns are defined from these structures by various methods. The demarcation of the stripes has two purposes:

the limitation of the injection current only inside stripes, the build up of a refractive index variation from the stripe to the adjacent lateral regions, to restrict the optical field inside the stripe.

A very common used method to define the stripes is the creation of a ridge, by partial etching of the p-type confinement regions and by the subsequent oxidation of the regions where the etching was performed. This ridge is covered by a metal contact and through it the electric current will flow. The thinning of the p-type confinement region produces a small decrease of the effective refractive index which is used for the (partial) confinement of the optical field. The disadvantage of this method resides in the fact that the active region is not removed outside the stripe and that its lateral regions that are not excited by the electric current are strongly absorbant, that enhances the modal attenuation coefficient.

Figure 7:
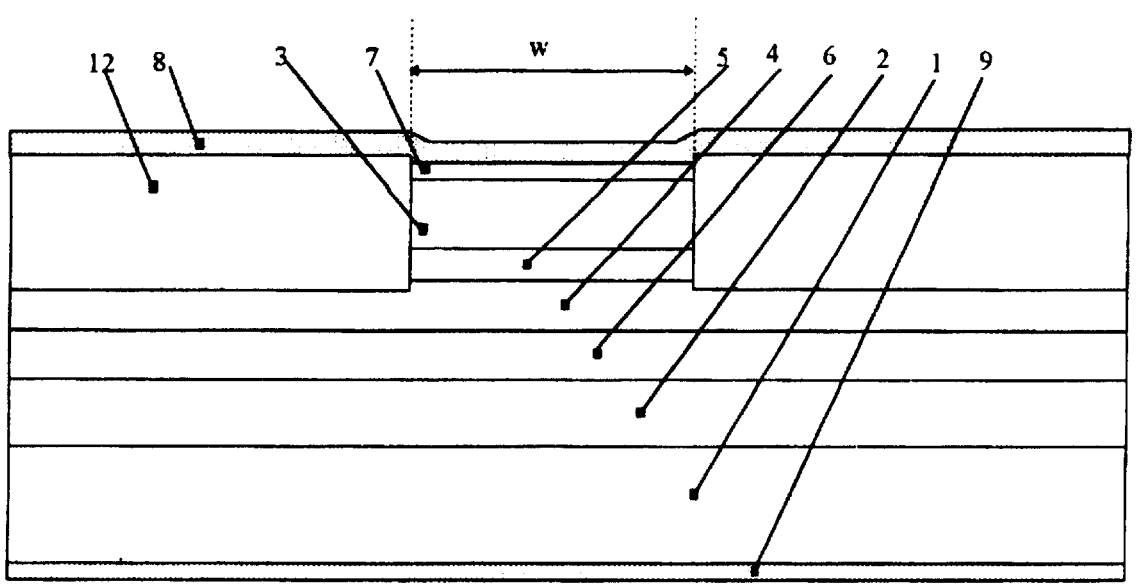
FIG. 7: a transversal section through a structure with a stripe

In FIG. 7 a section through a stripe structure is presented, which derives from a dual planar structure, with two bumps of the refractive index profile in the Ox-direction of the materials which forms the planar structure. The stripe has a width w. Along the w width, the eptaxial structure contains all the regions described in FIG. 2. On both sides of the stripe, the epitaxial structure contains a i-type confinement region 12 and does not contain the active region 5 and the p-type confinement region 3. The i-type regions 12 can consists of a semiconductor material, from the same material system as the rest of materials from which the stripe structure is made, and can be insulating from electrical point of view. In the case of the $Al_xGa_{1-x}As$ system materials, their refractive index can be determined by their composition index. In the stripe zone, the wave guide of width w is formed mainly around the bump of balance region, and is laterally bordered by wave guides formed mainly around the same bump of the balance region, not containing the active region.

From the adjustment of the refractive index of the regions 12 one can obtain a fine tuning of the effective refractive indexes in the stripe wave guide and in the lateral wave guides, such that the variations of the effective refractive indexes to permit the operation in the lateral fundamental mode. Thus, for the structures number 6, 10 and 14 from table 1, having all a confinement factor of 0.0072, by eliminating the p-type confinement region 3 and the active region 5 and substituting them with i-type confinement regions 12 having a composition index $x_{12}=0.35$, the variation of the effective refractive indexes are equal to 0.0003, i.e. the optimum value for stripes of 12 $\mu$m width, which corresponds to the chosen confinement factor [1].

We claim:

1. A high power laser diode comprising a substrate and a structure that acts as a waveguide for a radiation field, said structure including:

an n-type confinement region (2);

a p-type confinement region (3) which has the lowest value of the refractive index in the structure;

a first passive region (4) situated between the two confinement regions (2) and (3), which represents the main part of the wave guide and whose refractive index is intermediate between the refractive index of the p-type confinement region (3) and the refractive index of the n-type confinement region (2); the refractive index of the first passive region (4) has a monotonous trend from one of its ends toward the other;

an active region (5) situated between the p-type confinement region (3) and the passive region (4), whose refractive index is much higher that the refractive index of the passive region (4);

a trapping region (6), situated between the passive region (4) and the n-type confinement region (2), which balance the attraction of the radiation field by the active region (5) and whose refractive index is higher than the refractive index of its neighbor regions, i.e. the passive region (4) and n-type confinement region (2);

the structure being such that:

the refractive index profile has two marked bumps, one corresponding to the active region (5) and the other corresponding to the trapping region (6);

the energy band-gap of the trapping region (6) is much greater than the energy band-gap of the active region (5) to avoid the absorption in the trapping region (6) of the radiation emitted in the active region (5);

the attraction of the radiation field by the trapping region (6) and the repelling of the radiation field by the refractive index which increases from an interior margin of the p-type confinement region (3) toward the n type confinement region (2) both assure a reduced value for the confinement factor of the active region (5).

2. A high power laser diode according to claim 1, comprising at least one secondary trapping regions placed between the active region (5) and the main trapping region (6).

3. A high power laser diode according to claim 1, comprising a stripe structure, and on each side of the stripe the epitaxially structure contains a confinement region (12) and does not contain the active region (5) and the p-type confinement region (3), so that in the area of the stripe, the wave guide of width w is formed mainly around a bump of the trapping region and is restricted laterally by wave guides formed mainly around the same bump of the trapping region.

4. A high power laser diode according to claim 1 comprising a second passive region (4') situated between the p-type confinement region (3) and the active region (5); the second passive region having a refractive index intermediate between the refractive index of the p-type confinement region and the refractive index of the first passive region; and, the refractive index of the second passive region (4') having a monotonous trend from one of its ends toward the other.

5. A high power laser diode according to claim 1 wherein the passive region has a constant value.

6. A high power laser diode according to claim 1 wherein the p-type confinement region refractive index is equal to the n-type confinement region refractive index and also equal to the refractive index of the passive region.

7. A high power laser diode according to claim 1 wherein the active region bump has the property that a thickness of the active region (5) multiplied by the square root of the difference between the active region refractive index squared and adjacent passive region refractive index squared is less than $\lambda/4$; and the trapping region bump has the property that the trapping region thickness multiplied by the square root of the difference between the trapping region refractive index squared and the n-type confinement region refractive index squared is less than $\lambda/4$.

8. A high power laser diode according to claim 2 wherein the passive region has a constant value.

9. A high power laser diode according to claim 2 wherein the p-type confinement region refractive index is equal to the n-type confinement region refractive index and also equal to refractive index of the passive region.

* * * * *